US010008499B2

(12) United States Patent
Lim et al.

(10) Patent No.: US 10,008,499 B2
(45) Date of Patent: Jun. 26, 2018

(54) METHOD TO FORM SILICIDE AND CONTACT AT EMBEDDED EPITAXIAL FACET

(71) Applicant: Texas Instruments Incorporated, Dallas, TX (US)

(72) Inventors: Kwan-Yong Lim, Plano, TX (US); James Walter Blatchford, Richardson, TX (US); Shashank S. Ekbote, Allen, TX (US); Younsung Choi, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/723,373

(22) Filed: Oct. 3, 2017

(65) Prior Publication Data
US 2018/0047728 A1 Feb. 15, 2018

Related U.S. Application Data

(63) Continuation of application No. 15/336,248, filed on Oct. 27, 2016, now Pat. No. 9,812,452, which is a (Continued)

(51) Int. Cl.
*H01L 21/8238* (2006.01)
*H01L 21/8234* (2006.01)
(Continued)

(52) U.S. Cl.
CPC .... *H01L 27/092* (2013.01); *H01L 21/823481* (2013.01); *H01L 21/823807* (2013.01);
(Continued)

(58) Field of Classification Search
CPC .............. H01L 27/092; H01L 29/4175; H01L 29/66636; H01L 29/7845; H01L 29/78624; H01L 29/66515; H01L 29/0847; H01L 29/7848; H01L 29/4933; H01L 29/7835; H01L 23/535; H01L 21/823878; H01L 21/823807; H01L 21/823481;
(Continued)

(56) References Cited

U.S. PATENT DOCUMENTS

| 4,998,150 A | 3/1991 | Rodder et al. |
| 5,652,159 A | 7/1997 | Hirano |

(Continued)

FOREIGN PATENT DOCUMENTS

JP       2006253300 A       9/2006

*Primary Examiner* — Benjamin Sandvik
*Assistant Examiner* — Gustavo Ramallo
(74) *Attorney, Agent, or Firm* — Jacqueline J. Garner; Charles A. Brill; Frank D. Cimino

(57) ABSTRACT

An integrated circuit with an MOS transistor abutting field oxide and a gate structure on the field oxide adjacent to the MOS transistor and a gap between an epitaxial source/drain and the field oxide is formed with a silicon dioxide-based gap filler in the gap. Metal silicide is formed on the exposed epitaxial source/drain region. A CESL is formed over the integrated circuit and a PMD layer is formed over the CESL. A contact is formed through the PMD layer and CESL to make an electrical connection to the metal silicide on the epitaxial source/drain region.

17 Claims, 16 Drawing Sheets

Related U.S. Application Data continuation of application No. 14/563,062, filed on Dec. 8, 2014, now Pat. No. 9,508,601.

(60) Provisional application No. 61/914,995, filed on Dec. 12, 2013.

(51) Int. Cl.
  *H01L 27/092* (2006.01)
  *H01L 23/535* (2006.01)
  *H01L 29/417* (2006.01)

(52) U.S. Cl.
  CPC ........... *H01L 21/823814* (2013.01); *H01L 21/823878* (2013.01); *H01L 23/535* (2013.01); *H01L 29/4175* (2013.01)

(58) Field of Classification Search
  CPC ..... H01L 21/823814; H01L 21/823835; H01L 21/823443; H01L 21/823418; H01L 21/76897; H01L 21/28518; H01L 21/28097; H01L 21/28061; H01L 21/28052
  See application file for complete search history.

(56) References Cited

U.S. PATENT DOCUMENTS

| | | |
|---|---|---|
| 5,960,291 A | 9/1999 | Krivokapic |
| 6,008,097 A | 12/1999 | Yoon et al. |
| 6,140,232 A | 10/2000 | Lin et al. |
| 6,150,212 A | 11/2000 | Divakaruni et al. |
| 6,169,011 B1 | 1/2001 | Hsu |
| 6,268,255 B1 | 7/2001 | Besser et al. |
| 6,376,885 B1 | 4/2002 | Tseng |
| 8,609,493 B2 | 12/2013 | Yamamoto et al. |
| 9,812,452 B2* | 11/2017 | Lim .................. H01L 27/092 |
| 2006/0102955 A1 | 5/2006 | Chen et al. |
| 2009/0166755 A1 | 7/2009 | Chakravarthi et al. |
| 2009/0218633 A1* | 9/2009 | Hoentschel ..... H01L 21/823807 257/369 |
| 2009/0256178 A1 | 10/2009 | Matsuo et al. |
| 2011/0193167 A1 | 8/2011 | Fung et al. |
| 2012/0091539 A1* | 4/2012 | Fan ................. H01L 21/28123 257/401 |
| 2013/0316535 A1 | 11/2013 | Shin et al. |
| 2013/0316536 A1 | 11/2013 | Seto et al. |

* cited by examiner

METHOD TO FORM SILICIDE AND CONTACT AT EMBEDDED EPITAXIAL FACET

CROSS-REFERENCE TO RELATED APPLICATIONS

This application is a continuation of U.S. Nonprovisional patent application Ser. No. 15/336,248, filed Oct. 27, 2016, which is a continuation of U.S. Nonprovisional patent application Ser. No. 14/563,062, filed Dec. 8, 2014 (now U.S. Pat. No. 9,508,601), which claims the benefit of U.S. Provisional Application 61/914,995, filed Dec. 12, 2013, the contents of all of which are herein incorporated by reference in its entirety.

FIELD OF THE INVENTION

This invention relates to the field of integrated circuits. More particularly, this invention relates to epitaxial regions of MOS transistors in integrated circuits.

BACKGROUND OF THE INVENTION

An integrated circuit may include a metal oxide semiconductor (MOS) transistor with epitaxial source/drain regions. For example, a p-channel metal oxide semiconductor (PMOS) transistor may have silicon-germanium epitaxial source/drain regions. An n-channel metal oxide semiconductor (NMOS) transistor may have phosphorus-doped silicon epitaxial source/drain regions. An instance of the epitaxial source/drain regions may abut field oxide formed by a shallow trench isolation (STI) process. The epitaxial source/drain region may have a highly angled surface facet and a cavity between the epitaxial material and the dielectric material of the field oxide.

A gate structure may be located on the field oxide adjacent to the epitaxial source/drain region so that dielectric spacer material on a lateral surface of the gate structure may extend into the cavity and down to the epitaxial material, reducing an area for metal silicide on the epitaxial source/drain region. A contact disposed on the epitaxial source/drain region may undesirably provide a high resistance connection to the MOS transistor due to the reduced silicide area and possibly in combination with alignment tolerance of the contact to the source/drain region.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an MOS transistor abutting field oxide and a gate structure on the field oxide adjacent to a source/drain region of the MOS transistor is formed by forming a patterned epitaxy hard mask layer over the MOS transistor and the gate structure on the field oxide, which exposes the source/drain between the field oxide and a gate structure of the MOS transistor. Semiconductor material is epitaxially formed in the source/drain regions, so that an epitaxial source/drain region of the MOS transistor abutting the field oxide may have a highly angled surface facet and a gap may exist between the epitaxial semiconductor material and the dielectric material of the field oxide. A silicon dioxide-based gap filler is formed in the gap between the epitaxial semiconductor material and the dielectric material of the field oxide. Source/drain spacers are subsequently formed adjacent to lateral surfaces of the MOS gate structure and the gate structure on the field oxide. Metal silicide is formed on the exposed epitaxial semiconductor material. A conformal contact etch stop liner is formed over the MOS transistor and the gate structure on the field oxide. A contact is formed to the metal silicide on the epitaxial source/drain region abutting the field oxide.

DETAILED DESCRIPTION OF EXAMPLE EMBODIMENTS

Figure 1:
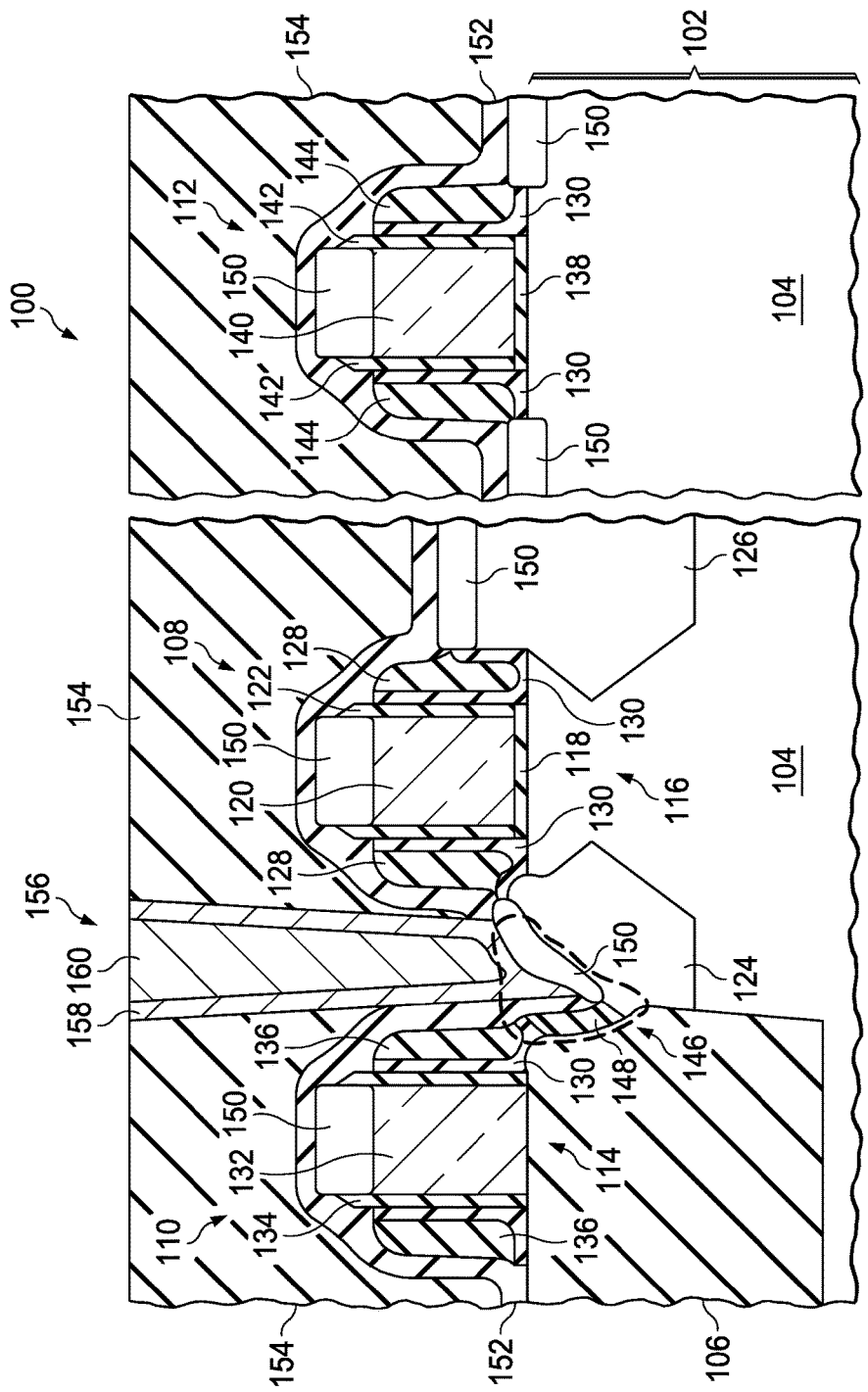
FIG. 1 is a cross section of an example integrated circuit containing a gap filler.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing an MOS transistor abutting field oxide and a gate structure on the field oxide adjacent to a source/drain region of the MOS transistor is formed by forming a patterned epitaxy hard mask layer over the MOS transistor and the gate structure on the field oxide, which exposes the source/drain between the field oxide and a gate structure of the MOS transistor. Semiconductor material is epitaxially formed in the source/drain regions, so that an epitaxial source/drain region of the MOS transistor abutting the field oxide may have a highly angled surface facet and a gap may exist between the epitaxial semiconductor material and the dielectric material of the field oxide. A silicon dioxide-based gap filler is formed in the gap between the epitaxial semiconductor material and the dielectric material of the field oxide.

In one example fabrication process sequence, a conformal layer of silicon dioxide-based dielectric material is formed over the integrated circuit, extending into the gap between the epitaxial semiconductor material and the field oxide. Subsequently an isotropic etchback process removes the silicon dioxide-based dielectric material from over the MOS transistor and the gate structure on the field oxide, leaving the gap filler. Source/drain spacers which are predominantly non-silicon dioxide are formed adjacent to the gate structure of the MOS transistor and the gate structure on the field oxide which advantageously leave at least one half of the epitaxial source/drain region of the MOS transistor abutting the field oxide exposed.

In another example fabrication process sequence, a silicon dioxide-based first sublayer of source/drain spacers is conformally formed over the integrated circuit, extending into the gap between the epitaxial semiconductor material and the field oxide. Subsequently an anisotropic etchback process removes the first sublayer from tops surfaces of the MOS transistor and the gate structure on the field oxide, leaving first source/drain spacers adjacent to the gate structure of the MOS transistor and the gate structure on the field oxide. The first spacer on the gate structure on the field oxide extends into the gap between the epitaxial semiconductor material and the field oxide, providing the gap filler. A silicon nitride-based second sublayer of the source/drain spacers is conformally formed over the integrated circuit. An anisotropic etchback removes the second sublayer to leave silicon nitride-based second spacers. At least one third of the epitaxial source/drain region of the MOS transistor abutting the field oxide is exposed.

Following formation of the gap filler, such as by either of the example fabrication process sequences described above, metal silicide is formed on the exposed epitaxial source/drain region. A conformal contact etch stop layer (CESL) is formed over the integrated circuit and a pre-metal dielectric (PMD) layer is formed over the CESL. A contact is formed through the PMD layer and CESL to make an electrical connection to the metal silicide on the epitaxial source/drain region.

FIG. 1 is a cross section of an example integrated circuit containing a gap filler. The integrated circuit 100 is formed in and on a substrate 102 which includes semiconductor material 104 such as single crystal silicon extending to a top surface of the substrate 102. Field oxide 106 is formed in the substrate 102, for example using a STI process.

The integrated circuit 100 includes a first MOS transistor 108 having a first polarity adjacent to the field oxide 106, a gate structure 110 on the field oxide 106 adjacent to the first MOS transistor 108, and a second MOS transistor 112 having a second, opposite, polarity. A top surface 114 of the field oxide 106 is coplanar within 20 nanometers with a top surface 116 of the semiconductor material 104 under the first MOS transistor 108.

The first MOS transistor 108 includes a gate dielectric layer 118 at the top surface of the semiconductor material 104. The gate dielectric layer 118 may include silicon dioxide formed by thermal oxidation of the semiconductor material 104. The gate dielectric layer 118 may alternatively include deposited dielectric materials with high dielectric constants such as hafnium oxide, zirconium oxide and/or tantalum oxide. The first MOS transistor 108 includes a gate 120 over the gate dielectric layer 118. The gate 120 may include polycrystalline silicon, commonly referred to as polysilicon. The first MOS transistor 108 may include gate offset spacers 122 on lateral surfaces of the gate 120. The gate offset spacers 122 may include one or more layers of thermal oxide, deposited silicon dioxide and/or deposited silicon nitride. The first MOS transistor 108 includes a first epitaxial source/drain region 124 in the substrate 102 between the gate 120 and the field oxide 106, such that the first epitaxial source/drain region 124 abuts the field oxide 106. The first MOS transistor 108 also includes a second epitaxial source/drain region 126 in the substrate 102 adjacent to the gate 120 opposite from the first epitaxial source/drain region 124. The first MOS transistor 108 includes source/drain spacers 128 laterally adjacent to the gate 120 and abutting the gate offset spacers 122 if present. The source/drain spacers 128 include one or more layers of silicon nitride and/or silicon oxynitride or other non-silicon dioxide dielectric material. The first MOS transistor 108 may include an optional spacer liner 130 of silicon dioxide-based dielectric material under the source/drain spacers 128. The spacer liner 130 may be 3 nanometers to 10 nanometers thick.

The gate structure 110 may possibly have a gate dielectric layer of the same material as the gate dielectric layer 118 if the gate dielectric layer 118 is a deposited dielectric layer which is concurrently deposited on the semiconductor material 104 and the field oxide 106. If the gate dielectric layer 118 is, on the other hand, a thermally grown oxide layer which does not form on the field oxide 106, the gate structure 110 may be free of a gate dielectric layer, as depicted in FIG. 1. The gate structure 110 includes a gate 132 over the field oxide 106 and over the gate dielectric layer of the gate structure 110, if present. In the instant example, the gate 132 does not overlap an edge of the field oxide 106 adjacent to the first MOS transistor 108. The gate 132 may have the same composition and structure as the gate 120 of the first MOS transistor 108. The gate structure 110 may include gate offset spacers 134 on lateral surfaces of the gate 132 if the first MOS transistor 108 includes the gate offset spacers 122. The gate offset spacers 134 may have a similar composition and structure as the gate offset spacers 122 of the first MOS transistor 108. The gate structure 110 includes source/drain spacers 136 laterally adjacent to the gate 132 and abutting the gate offset spacers 134 if present. The source/drain spacers 136 have the same structure and composition as the source/drain spacers 128 of the first MOS transistor 108. The gate structure 110 may include the spacer liner 130 if present in the first MOS transistor 108.

The second MOS transistor 112 includes a gate dielectric layer 138 at the top surface of the semiconductor material 104. The gate dielectric layer 138 may possibly have the same composition and structure as the gate dielectric layer 118 of the first MOS transistor 108. The second MOS transistor 112 includes a gate 140 over the gate dielectric layer 138. The gate 140 may possibly have a similar composition and structure as the gate 120 of the first MOS transistor 108. The second MOS transistor 112 may include gate offset spacers 142 on lateral surfaces of the gate 140. The gate offset spacers 142 may include one or more layers of thermal oxide, deposited silicon dioxide and/or deposited silicon nitride, and may possibly have a similar structure and composition as the gate offset spacers 122 of the first MOS transistor 108. The second MOS transistor 112 includes source/drain spacers 144 laterally adjacent to the gate 140 and abutting the gate offset spacers 142 if present. The source/drain spacers 144 may possibly have the same structure and composition as the source/drain spacers 128 of the first MOS transistor 108. The second MOS transistor 112 may include the spacer liner 130 if present in the first MOS transistor 108.

The first epitaxial source/drain region 124 has an angled facet facing the field oxide 106 and so is laterally separated from the field oxide 106 at the top surface 114 of the field oxide 106, forming a gap 146 between the first epitaxial source/drain region 124 and the field oxide 106 which extends at least 20 nanometers down from the top surface 114. A silicon dioxide-based gap filler 148 is disposed in the gap 146 abutting the field oxide 106 and extending down to and contacting the first epitaxial source/drain region 124 at a bottom of the gap 146. In the instant example, the gap filler 148 extends up to the source/drain spacers 136 of the gate structure 110, touching the spacer liner 130 if present, or touching the source/drain spacers 136 if the spacer liner 130 is not present.

Metal silicide 150 is disposed on the first epitaxial source/drain region 124 and on the second epitaxial source/drain region 126. Additional metal silicide 150 may be disposed on source/drain regions of the second MOS transistor 112, on the gate 120 of the first MOS transistor 108, on the gate 132 of the gate structure 110 and on the gate 140 of the second MOS transistor 112. The metal silicide 150 on the first epitaxial source/drain region 124 extends into the gap 146 on the angled facet and covers at least one half of the first epitaxial source/drain region 124. The metal silicide 150 may include, for example, nickel silicide.

A CESL 152 is disposed over the first MOS transistor 108, the gate structure 110 and the second MOS transistor 112. The CESL 152 is predominantly non-silicon dioxide-based dielectric material such as silicon nitride, 10 nanometers to 30 nanometers thick. A PMD layer 154 is disposed over the CESL 152. The PMD layer 154 may be silicon dioxide-based dielectric material such as boron phosphorus silicate glass (BPSG). The PMD layer 154 may be planarized as depicted in FIG. 1, and may be, for example, 50 nanometers to 150 nanometers thick over the first MOS transistor 108, the gate structure 110 and the second MOS transistor 112.

A contact 156 is disposed through the PMD layer 154 and the CESL 152 to make direct connection with the metal silicide 150 on the first epitaxial source/drain region 124. The contact 156 may include a metal liner 158 of titanium and titanium nitride, and a fill metal 160 of tungsten. The gap filler 148 may prevent the gap 146 from being filled with the source/drain spacers 136 and the CESL 152, thus advantageously allowing the metal silicide 150 to occupy a larger fraction of the angled facet of the first epitaxial source/drain region 124 and provide a lower resistance connection between the contact 156 and the first epitaxial source/drain region 124.

In one version of the instant example, the first MOS transistor 108 may be a PMOS transistor 108, and the first epitaxial source/drain region 124 and the second epitaxial source/drain region 126 may be silicon-germanium, and the second MOS transistor 112 may be an NMOS transistor 112. In an alternate version, the first MOS transistor 108 may be an NMOS transistor 108, and the first epitaxial source/drain region 124 and the second epitaxial source/drain region 126 may be phosphorus doped silicon, and the second MOS transistor 112 may be a PMOS transistor 112.

Figure 2A:
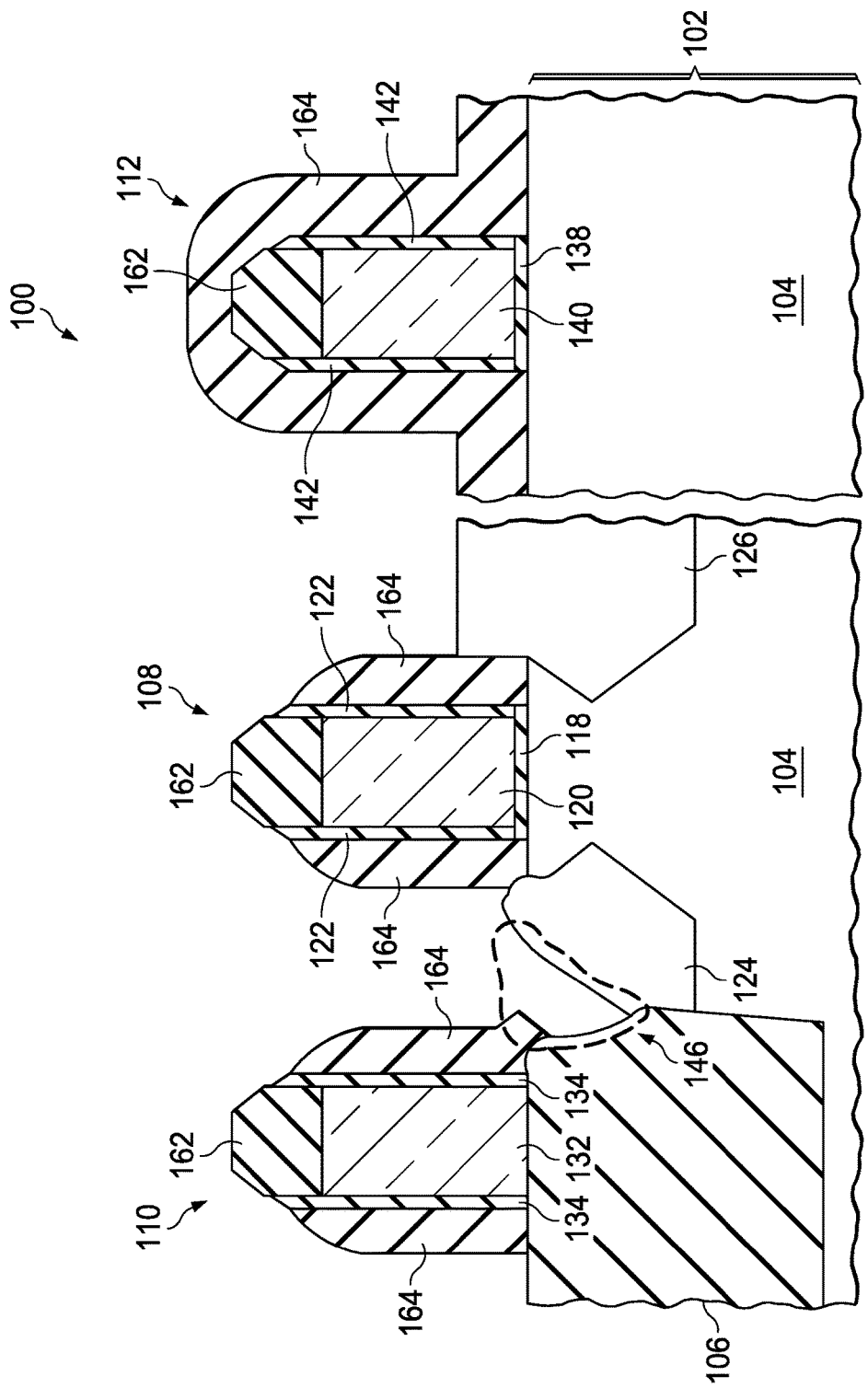
FIG. 2A through FIG. 2H are cross sections of the integrated circuit of FIG. 1, depicted in successive stages of fabrication.

FIG. 2A through FIG. 2H are cross sections of the integrated circuit of FIG. 1, depicted in successive stages of fabrication. Referring to FIG. 2A, the integrated circuit 100 has completed formation of epitaxial source/drain regions for transistors having the first polarity. The first MOS transistor 108 has the gate dielectric layer 118, the gate 120, the gate offset spacers 122 and the first epitaxial source/drain region 124 and the second epitaxial source/drain region 126 in place. The gate structure 110 has the gate 132 and the gate offset spacers 134 in place. The second MOS transistor 112 has the gate dielectric layer 138, the gate 140 and the gate offset spacers 142 in place.

Gate hard mask material 162 may be disposed over the gates 120, 132 and 142 from a gate etch operation. An epitaxy hard mask 164 is adjacent to lateral surfaces of the gate 120 of the first MOS transistor 108, adjacent to lateral surfaces of the gate 132 of the gate structure 110 and covers the second MOS transistor 112. The epitaxy hard mask 164 may include, for example, silicon nitride 15 nanometers to 25 nanometers thick. The epitaxy hard mask 164 was used to define lateral extents of the first epitaxial source/drain region 124 and the second epitaxial source/drain region 126. The gap 146 between the first epitaxial source/drain region 124 and the field oxide 106 is substantially free of material.

Figure 2B:
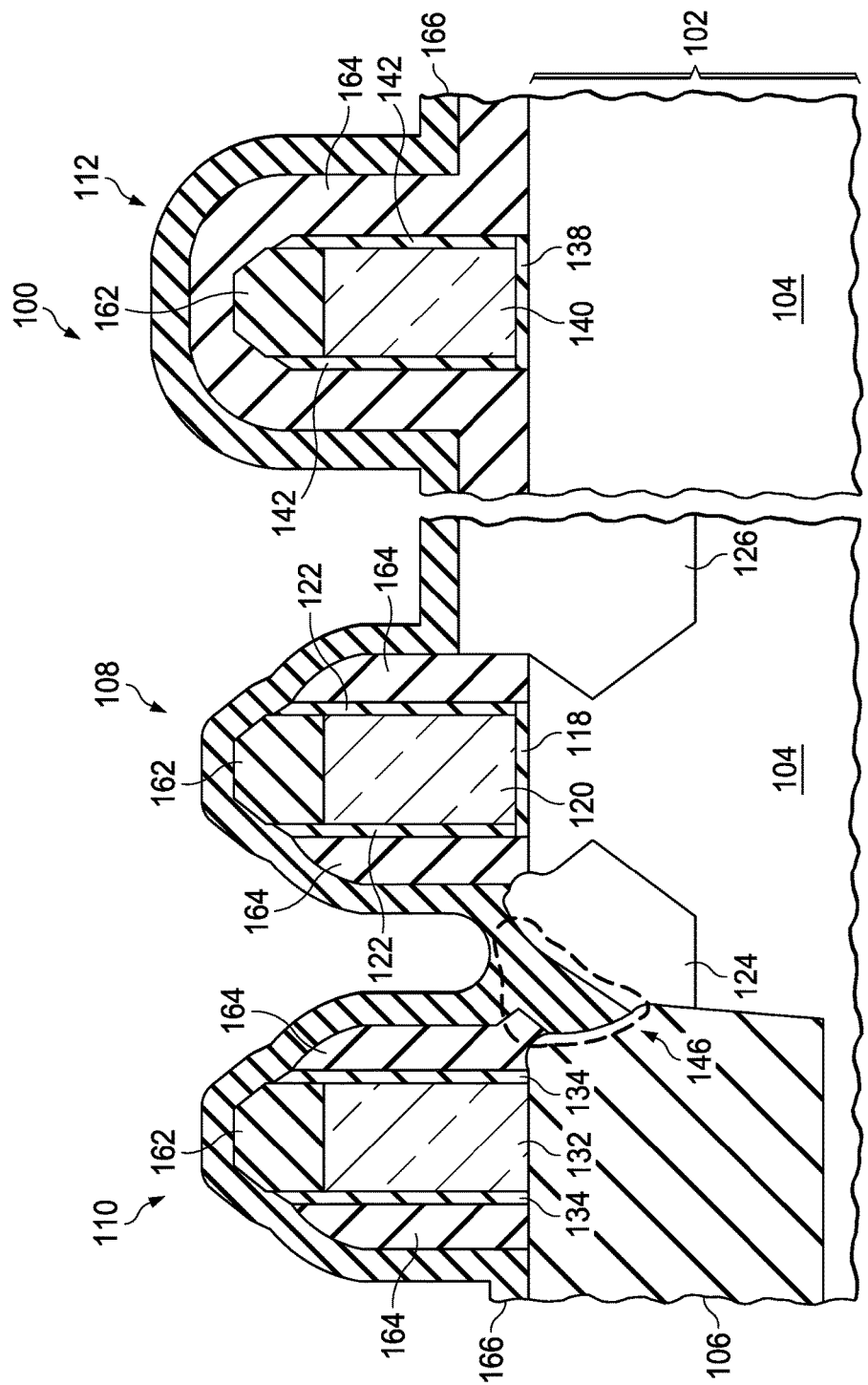

Referring to FIG. 2B, a gap fill layer 166 of silicon dioxide-based dielectric material is formed over an existing top surface of the integrated circuit 100, extending into and substantially filling the gap 146. The gap fill layer 166 may include, for example, 15 nanometers to 25 nanometers of silicon dioxide formed by a plasma enhanced chemical vapor deposition (PECVD) process using tetraethyl orthosilicate, also known as tetraethoxysilane or TEOS. The thickness of the gap fill layer 166 is high enough to substantially fill the gap 146 and is low enough to avoid completely filling between the gate 120 of the first MOS transistor 108 and the gate 132 of the gate structure 110.

Figure 2C:
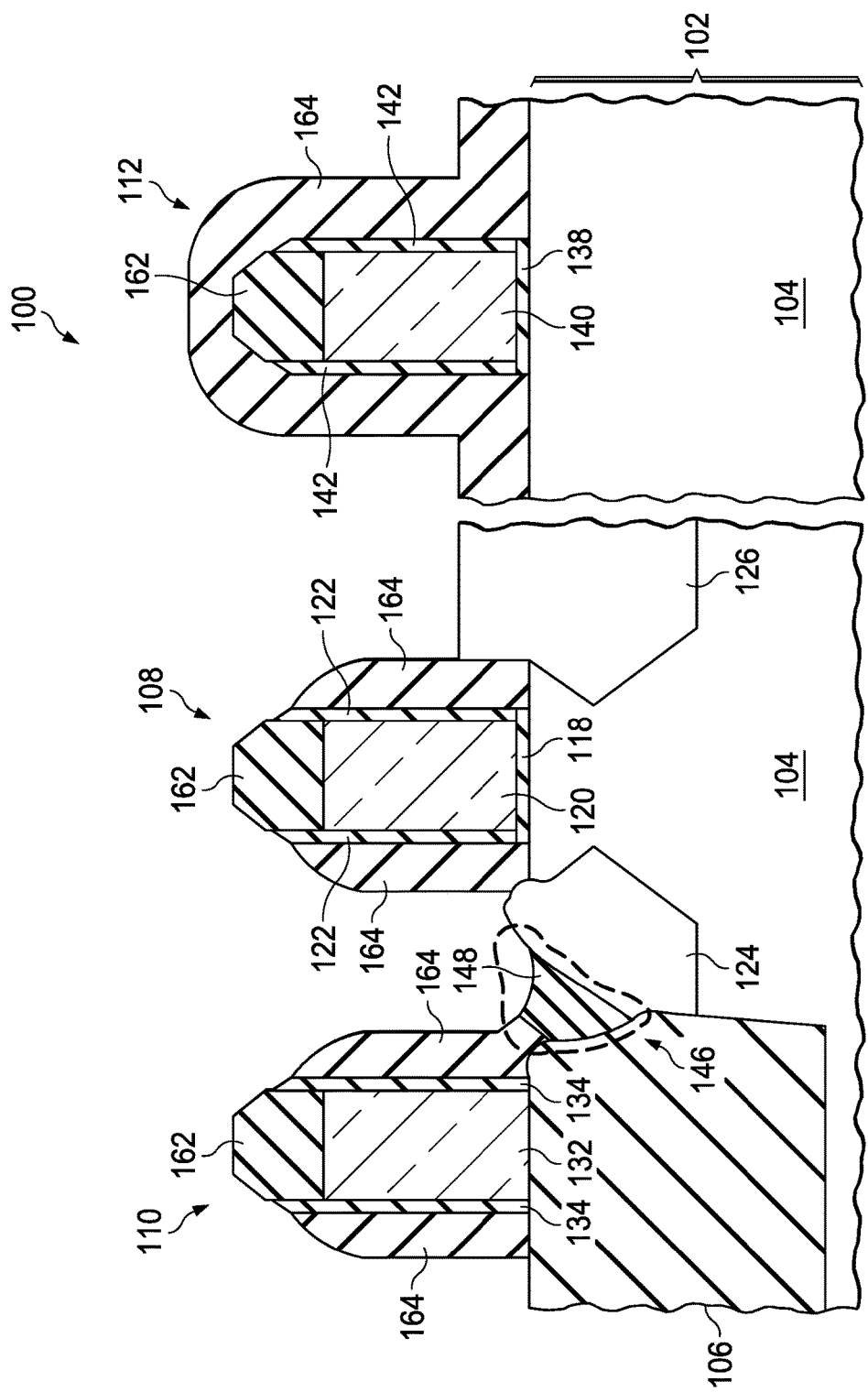

Referring to FIG. 2C, the gap fill layer 166 of FIG. 2B is removed from over the first MOS transistor 108, the gate structure 110 and the second MOS transistor 112 to leave gap filler 148 substantially filling the gap 146. The gap fill layer 166 may be removed, for example, using an isotropic plasma etch which is selective to the epitaxy hard mask 164, or possibly using a timed wet etch in an aqueous solution of dilute hydrofluoric acid.

Figure 2D:
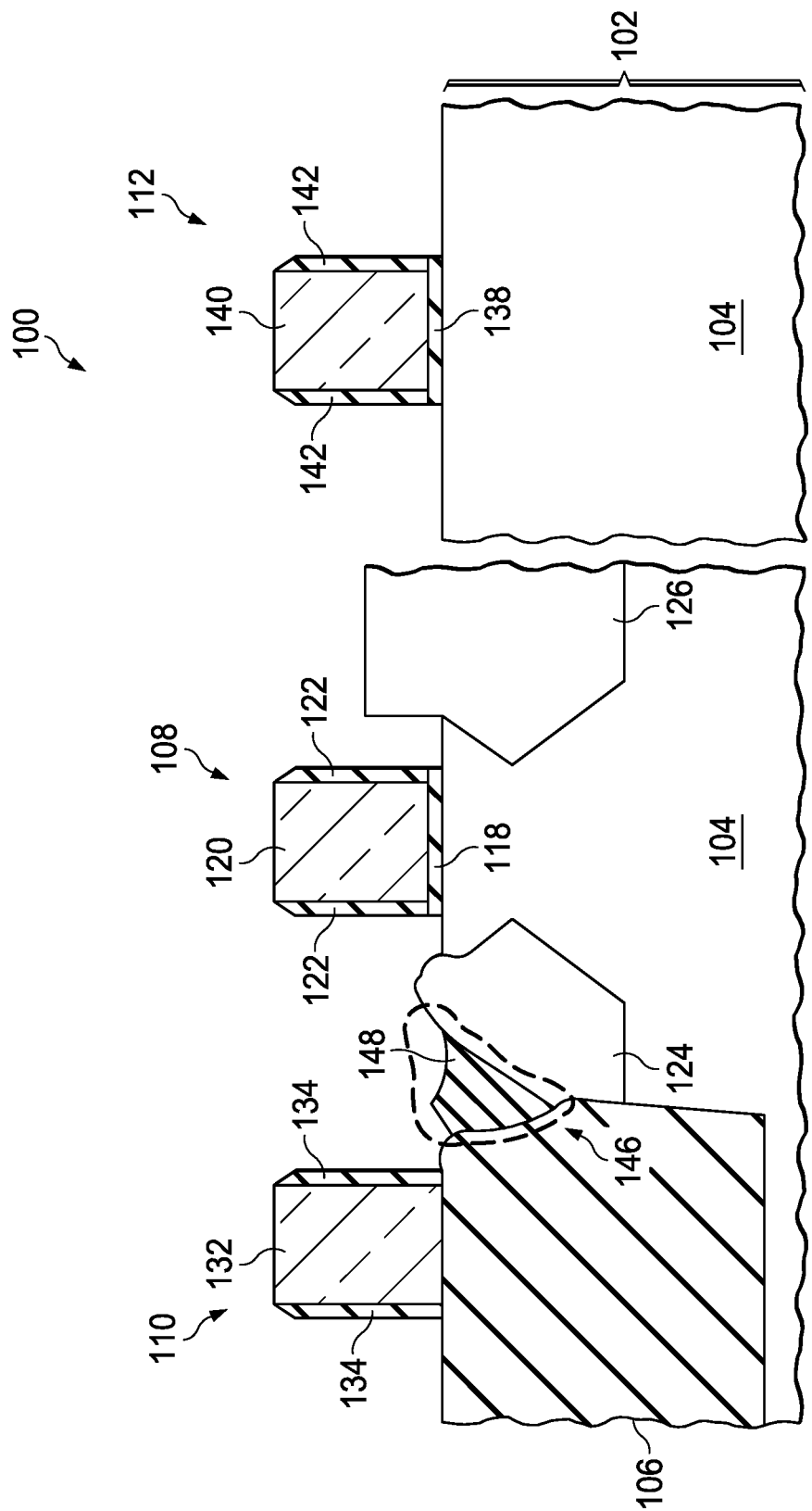

Referring to FIG. 2D, the epitaxy hard mask 164 of FIG. 2C is removed, leaving the gap filler 148 substantially filling the gap 146. The epitaxy hard mask 164 may be removed, for example, using an isotropic plasma etch which is selective to silicon dioxide. The gate hard mask material 162 of FIG. 2C, if present, is also removed, possibly concurrently with the epitaxy hard mask 164, or possibly in a separate etch step. If the gate hard mask material 162 included amorphous carbon, it may be removed by ashing.

Figure 2E:
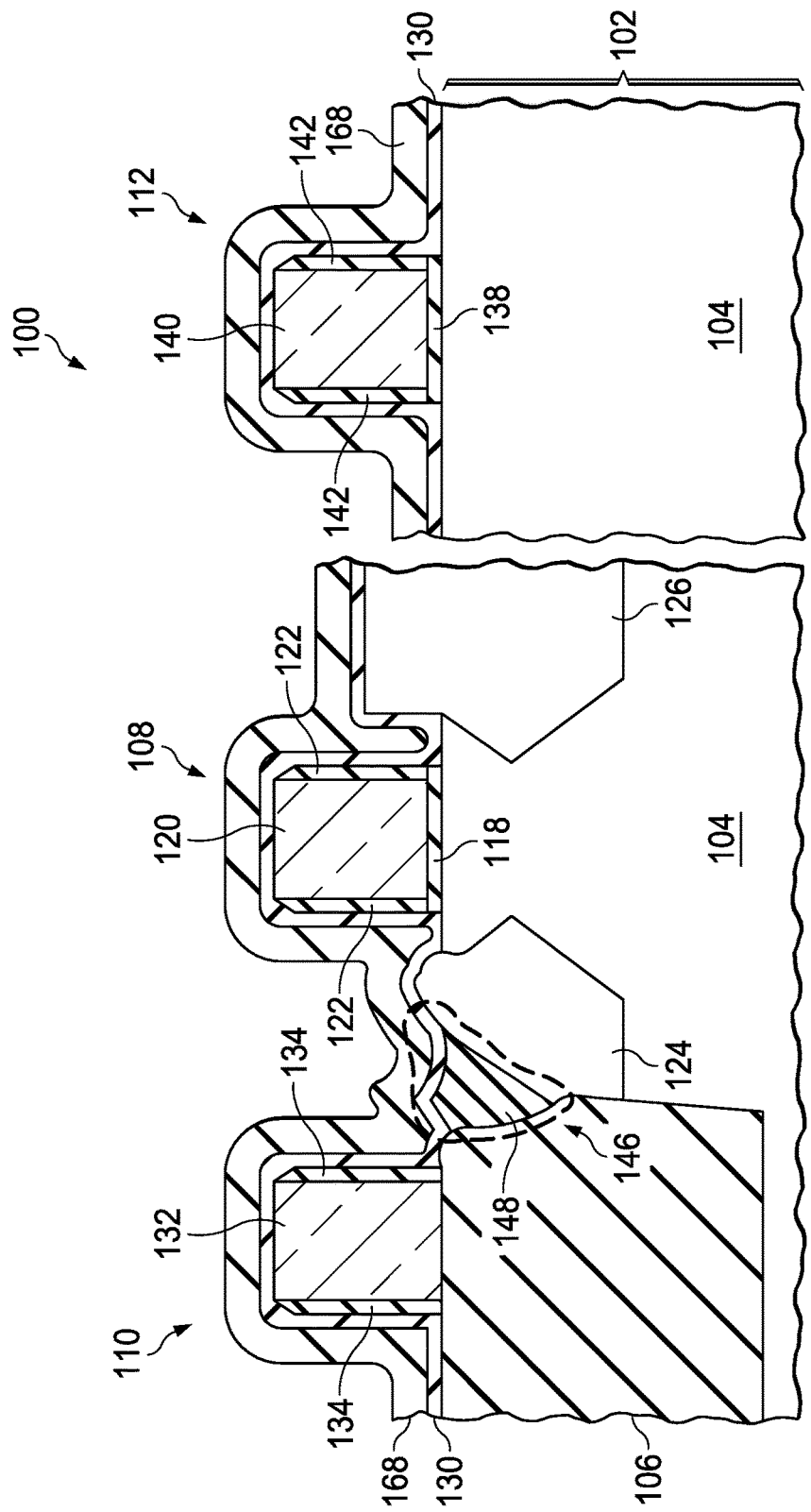

Referring to FIG. 2E, the optional spacer liner 130 may possibly be formed over an existing top surface of the integrated circuit 100. The spacer liner 168 may be formed, for example, by a PECVD process using TEOS.

A conformal layer of spacer material 168 is formed over the existing top surface of the integrated circuit 100, on the spacer liner 130 if present. The layer of spacer material 168 is predominantly non-silicon dioxide material such as silicon nitride and/or silicon oxynitride. The layer of spacer material 168 may be formed by a PECVD process using bis (tertiary-butylamino) silane (BTBAS), a PECVD process using a combination of BTBAS and TEOS, or a PECVD process using dichlorosilane and ammonia. The layer of spacer material 168 may be, for example, 15 nanometers to 30 nanometers thick.

Figure 2F:
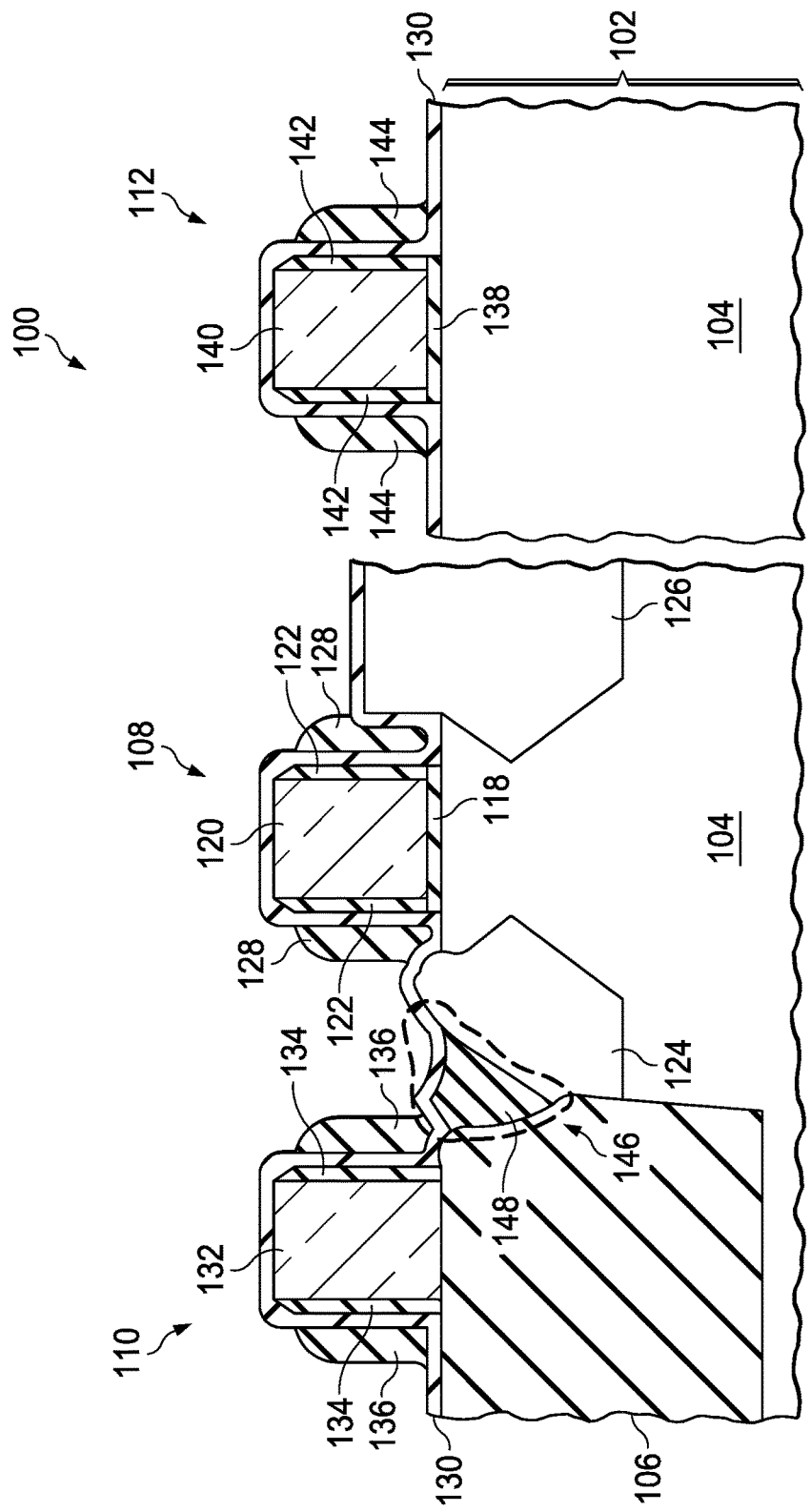

Referring to FIG. 2F, an anisotropic reactive ion etch (RIE) process removes the layer of spacer material 168 of FIG. 2E from over the gap filler 148 and the first epitaxial source/drain region 124 and the second epitaxial source/drain region 126, and from over tops of the gates 120, 132 and 140, to form the source/drain spacers 128 laterally adjacent to the gate 120 of the first MOS transistor 108, the source/drain spacers 136 laterally adjacent to the gate 132 of the gate structure 110, and the source/drain spacers 144 laterally adjacent to the gate 140 of the second MOS transistor 112. The RIE process leaves the gap filler 148 substantially intact.

Figure 2G:
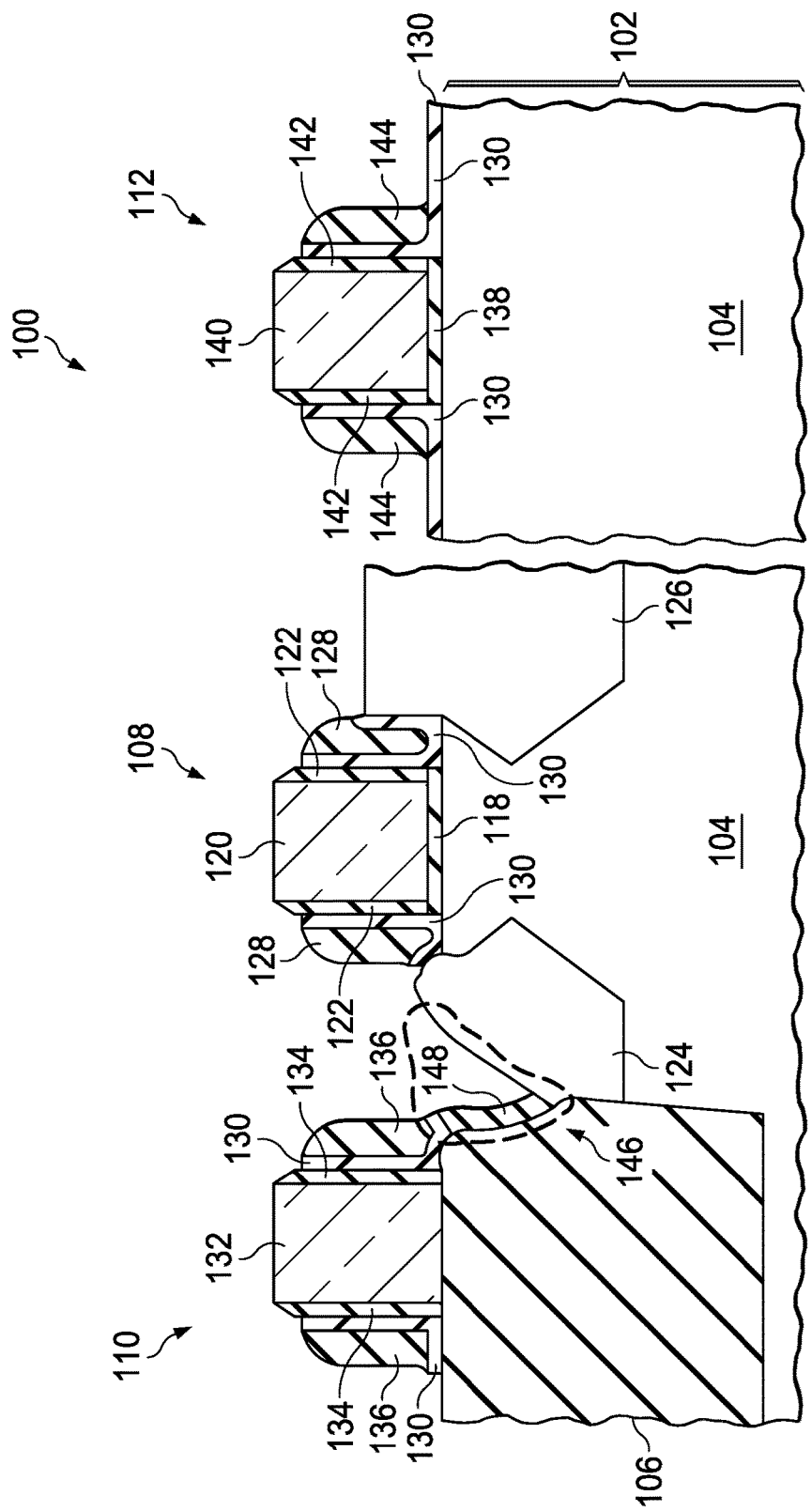

Referring to FIG. 2G, a silicon dioxide etch removes the spacer liner 130 which is exposed by the source/drain spacers 128, 136 and 144, and removes a portion of the gap filler 148 so as to expose at least a half of the first epitaxial source/drain region 124. The silicon dioxide etch may include an RIE process or may include a timed etch in an aqueous solution of dilute hydrofluoric acid. After the silicon dioxide etch is completed, the gap filler 148 abuts the field oxide 106 and extends down to and contacts the first epitaxial source/drain region 124 at a bottom of the gap 146, and extends up to the spacer liner 130.

Figure 2H:
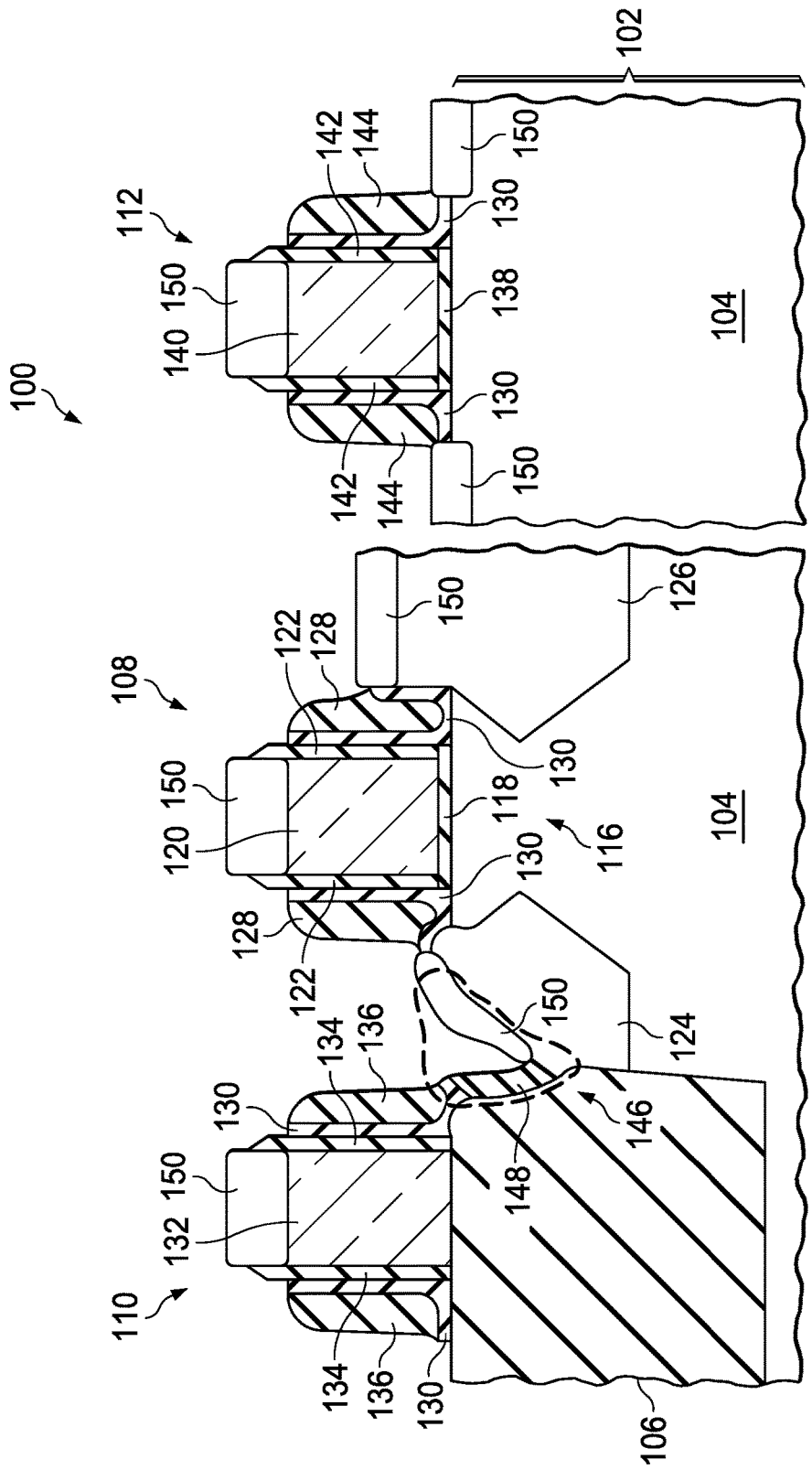

Referring to FIG. 2H, the metal silicide 150 is formed on exposed semiconductor material, including the first epitaxial source/drain region 124 and the second epitaxial source/drain region 126, and possibly the source/drain regions of the second MOS transistor 112. The metal silicide 150 may also be formed over the gates 120, 132 and 140. The metal silicide 150 on the first epitaxial source/drain region 124 extends into the gap 146 on the angled facet and covers at least one half of the first epitaxial source/drain region 124. The metal silicide 150 may be formed, for example, by depositing a layer of metal, such as nickel or cobalt, on a top surface of the integrated circuit 100, heating the integrated circuit 100 to react a portion of the metal with the exposed semiconductor material, and selectively removing unreacted metal by exposing the integrated circuit 100 to wet etchants including a mixture of an acid and hydrogen peroxide.

Following formation of the metal silicide 150, the CESL 152, PMD layer 154 and contact 156 are formed to provide the structure of FIG. 1. The CESL 152 may be formed, for example, by a PECVD process using dichlorosilane and ammonia. The PMD layer 154 may be formed, for example, by a PECVD process using silane, diborane, phosphine and nitrous oxide, or a high aspect ratio process (HARP) using silane, diborane, phosphine and ozone.

The contact 156 may be formed by etching a contact hole through the PMD layer 154 and CESL 152 to expose the metal silicide 150. The metal liner 158 of titanium and titanium nitride may be formed by a sputter process and an atomic layer deposition (ALD) process respectively. The fill metal 160 of tungsten may be formed by a metal organic chemical vapor deposition (MOCVD) process. The fill metal 160 and the metal liner 158 may be removed from a top surface of the PMD layer 154 by etchback or chemical mechanical polish (CMP) processes.

Figure 3A:
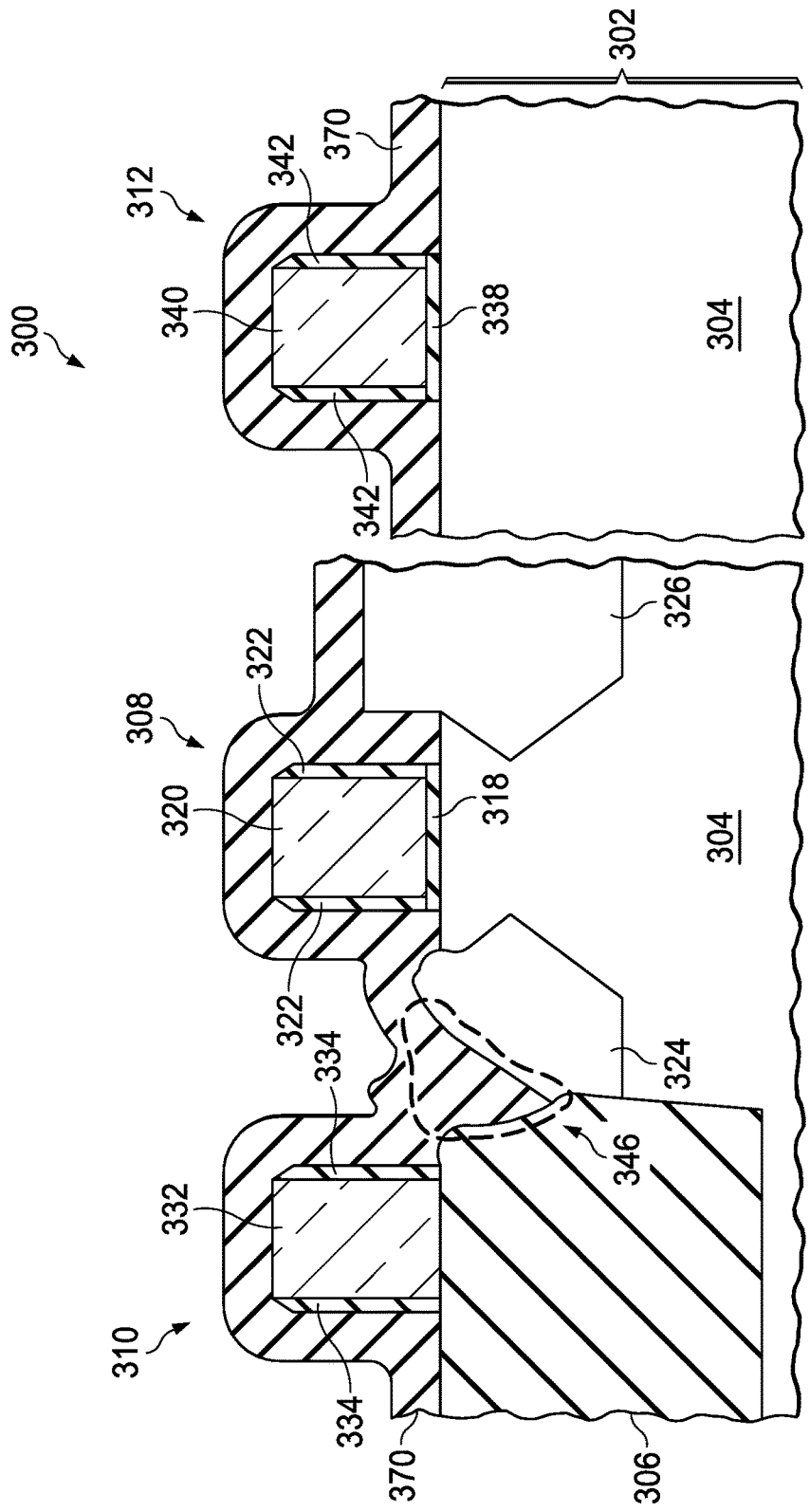
FIG. 3A through FIG. 3G are cross sections of another example integrated circuit depicted in successive stages of fabrication.

FIG. 3A through FIG. 3G are cross sections of another example integrated circuit depicted in successive stages of fabrication. Referring to FIG. 3A, the integrated circuit 300 is formed in and on a substrate 302 which includes semiconductor material 304 such as single crystal silicon extending to a top surface of the substrate 302. Field oxide 306 is formed in the substrate 302. The integrated circuit 300 includes a first MOS transistor 308 having a first polarity adjacent to the field oxide 306, a gate structure 310 on the field oxide 306 adjacent to the first MOS transistor 308, and a second MOS transistor 312 having a second, opposite, polarity. A top surface 314 of the field oxide 306 is coplanar within 20 nanometers with a top surface 316 of the semiconductor material 304 under the first MOS transistor 308. The integrated circuit 300 has completed formation of epitaxial source/drain regions for transistors having the first polarity. An epitaxy hard mask and any gate hard mask material have been removed.

The first MOS transistor 308 includes a gate dielectric layer 318 at the top surface of the semiconductor material 304. The gate dielectric layer 318 may include silicon dioxide formed by thermal oxidation of the semiconductor material 304, or may include deposited dielectric materials with high dielectric constants. The first MOS transistor 308 includes a gate 320, possibly polysilicon, over the gate dielectric layer 318. Gate offset spacers 322 may be disposed on lateral surfaces of the gate 320. The first MOS transistor 308 includes a first epitaxial source/drain region 324 in the substrate 302 between the gate 320 and the field oxide 306, such that the first epitaxial source/drain region 324 abuts the field oxide 306, and a second epitaxial source/drain region 326 in the substrate 302 adjacent to the gate 320 opposite from the first epitaxial source/drain region 324. The first epitaxial source/drain region 324 has an angled facet facing the field oxide 306 and so is laterally separated from the field oxide 306 at the top surface 314 of the field oxide 306, forming a gap 346 between the first epitaxial source/drain region 324 and the field oxide 306 which extends at least 20 nanometers down from the top surface 314.

The gate structure 310 may possibly have a gate dielectric layer of the same material as the gate dielectric layer 318 as explained in reference to FIG. 1. The gate structure 310 includes a gate 332 over the field oxide 306; in the instant example, the gate 332 does not overlap an edge of the field oxide 306 adjacent to the first MOS transistor 308. The gate 332 may have the same composition and structure as the gate 320 of the first MOS transistor 308. Gate offset spacers 334 may be disposed on lateral surfaces of the gate 332.

The second MOS transistor 312 includes a gate dielectric layer 338 at the top surface of the semiconductor material 304, possibly having the same composition and structure as the gate dielectric layer 318 of the first MOS transistor 308. The second MOS transistor 312 includes a gate 340 over the gate dielectric layer 338, possibly with a similar composition and structure as the gate 320 of the first MOS transistor 308. Gate offset spacers 342 may be disposed on lateral surfaces of the gate 340. The gate offset spacers 342 may possibly have a similar structure and composition as the gate offset spacers 322 of the first MOS transistor 308.

A silicon dioxide-based spacer layer 370 of subsequently formed source/drain spacers is conformally formed over an existing top surface of the integrated circuit 300, extending into, and substantially filling, the gap 346. The spacer layer 370 may include, for example, 15 nanometers to 30 nanometers of silicon dioxide formed by a PECVD process using TEOS. The thickness of the spacer layer 370 is high enough to substantially fill the gap 346 and is low enough to avoid completely filling between the gates 320 and 332.

Figure 3B:
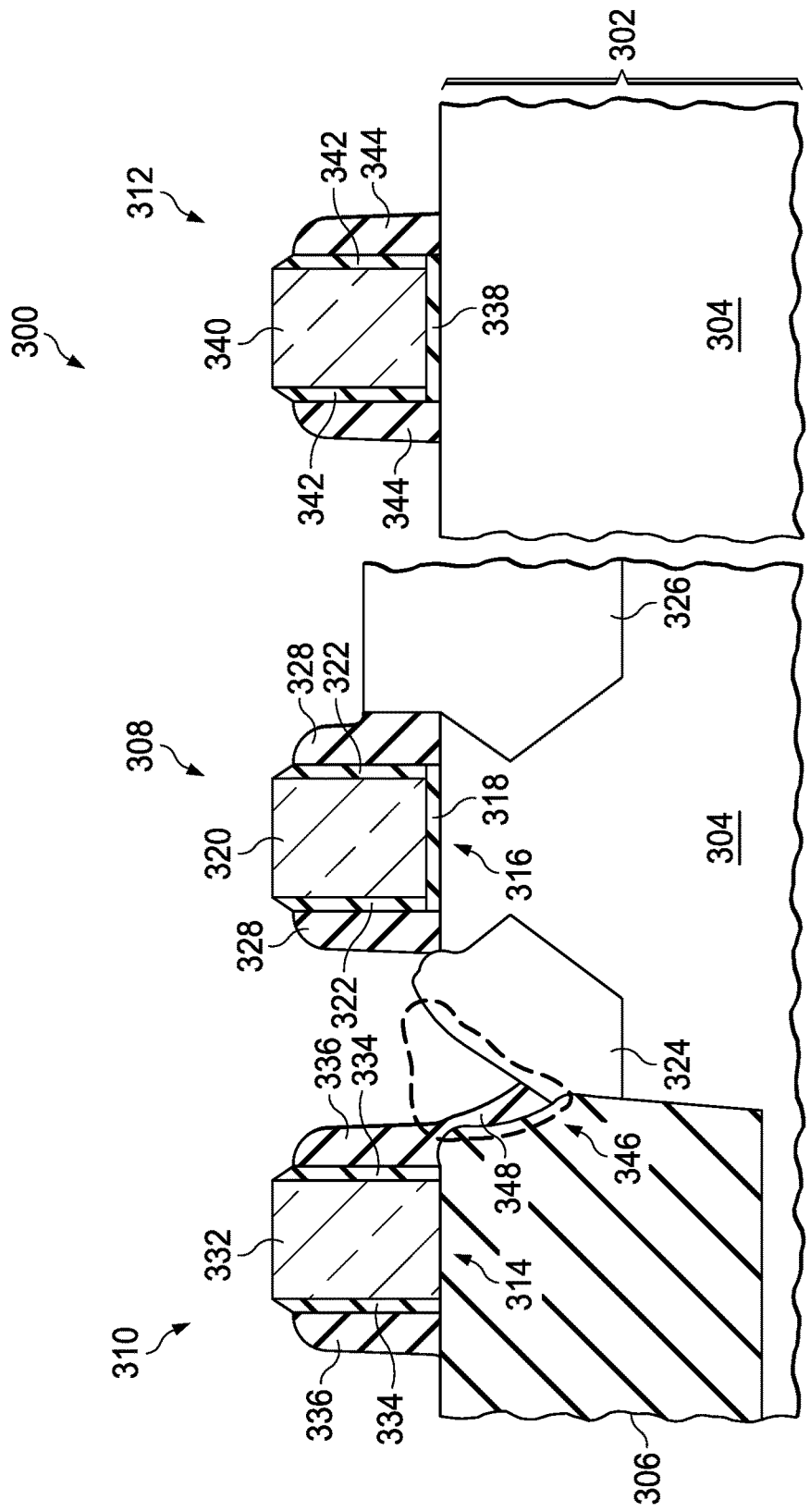

Referring to FIG. 3B, an anisotropic RIE process removes the spacer layer 370 of FIG. 3A from over a portion of the first epitaxial source/drain region 324 and from over the second epitaxial source/drain region 326, and from over tops of the gates 320, 332 and 340, to form source/drain spacers 328 laterally adjacent to the gate 320 of the first MOS transistor 308, source/drain spacers 336 laterally adjacent to the gate 332 of the gate structure 310, and source/drain spacers 344 laterally adjacent to the gate 340 of the second MOS transistor 312. The RIE process is performed so that the source/drain spacer 328 extends into the gap 346, abutting the field oxide 306 and extending down to and contacting the first epitaxial source/drain region 324 at a bottom of the gap 346, thus providing a gap filler 348.

Figure 3C:
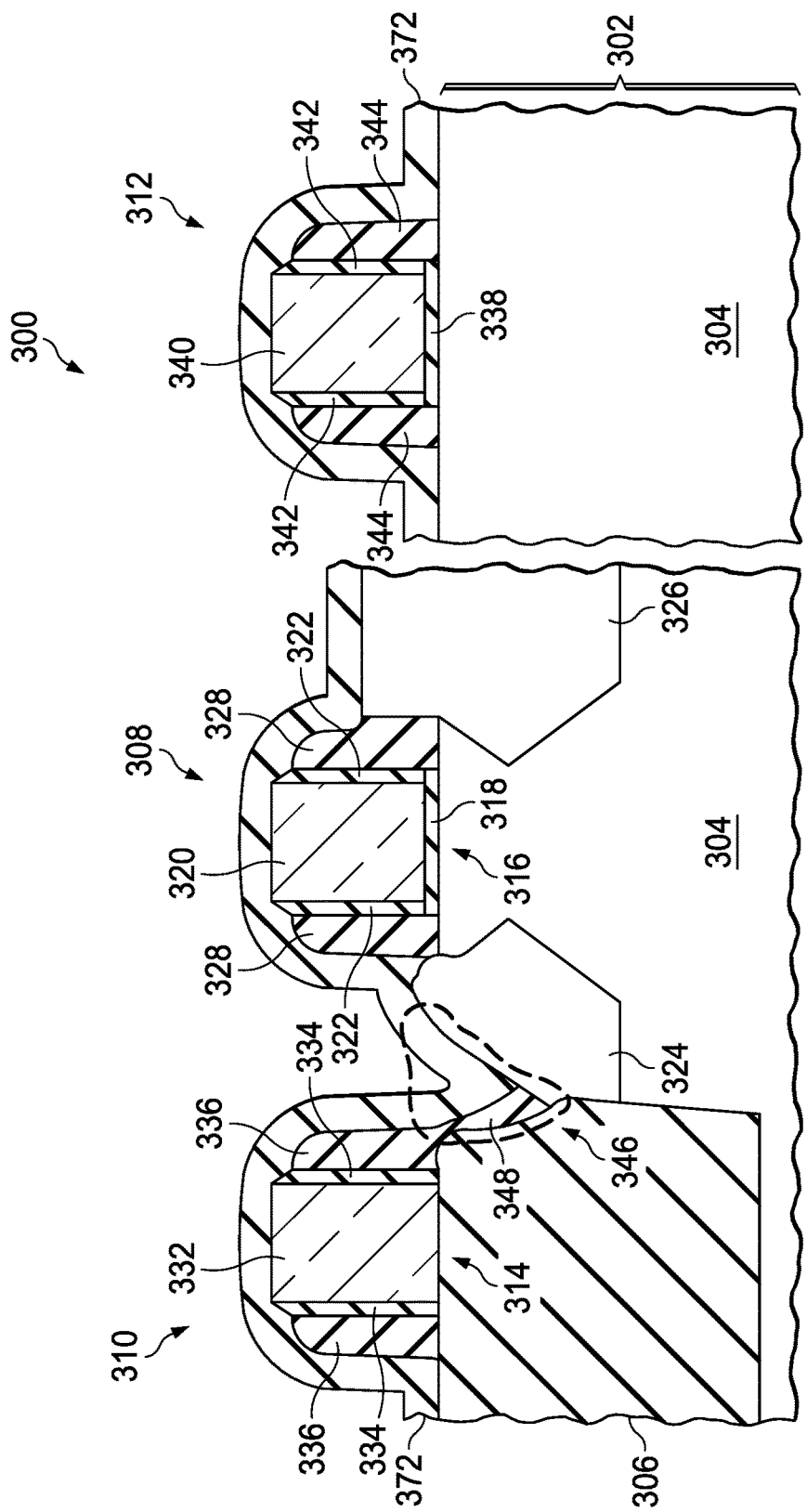

Referring to FIG. 3C, a non-silicon dioxide-based sacrificial layer 372 is conformally formed over an existing top surface of the integrated circuit 300. The sacrificial layer 372 may be, for example, 10 nanometers to 30 nanometers thick, and may be formed by a PECVD process using BTBAS, a PECVD process using a combination of BTBAS and TEOS, or a PECVD process using dichlorosilane and ammonia.

Figure 3D:
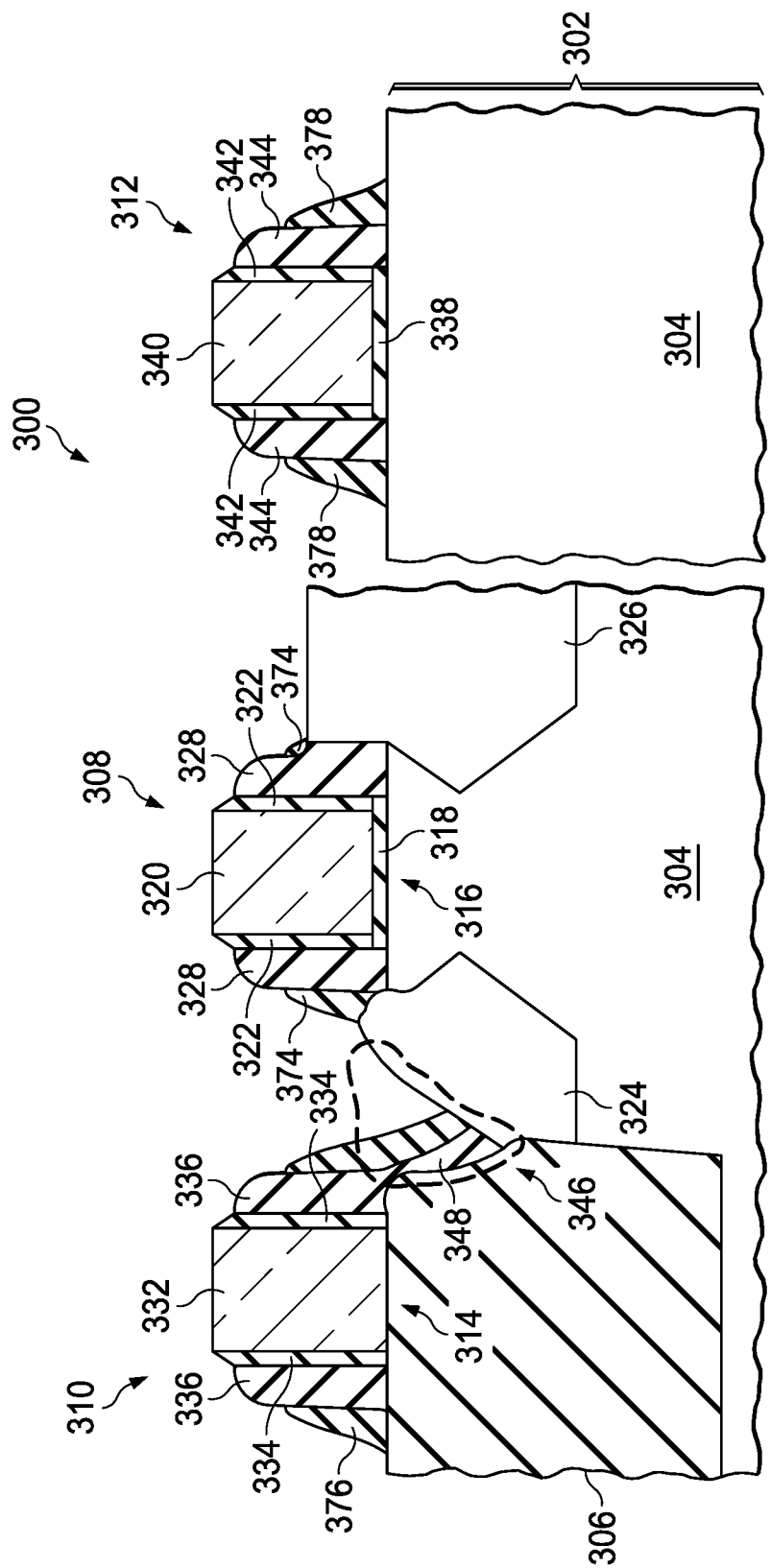

Referring to FIG. 3D, an anisotropic RIE process removes the sacrificial layer 372 of FIG. 3C from over a portion of the first epitaxial source/drain region 324 and a portion of the second epitaxial source/drain region 326, and from over tops of the gates 320, 332 and 340, to form sacrificial spacers 374 on the source/drain spacers 328 of the first MOS transistor 308, sacrificial spacers 376 on the source/drain spacers 328 of the gate structure 310, and sacrificial spacers 378 on the source/drain spacers 328 of the second MOS transistor 312. Forming the source/drain spacers 336 on the gate structure 310 so as to extend into the gap 346, providing the gap filler 348, may reduce a thickness of the sacrificial spacers 376 over the first epitaxial source/drain region 324, thereby exposing sufficient area for subsequent formation of metal silicide.

Figure 3E:
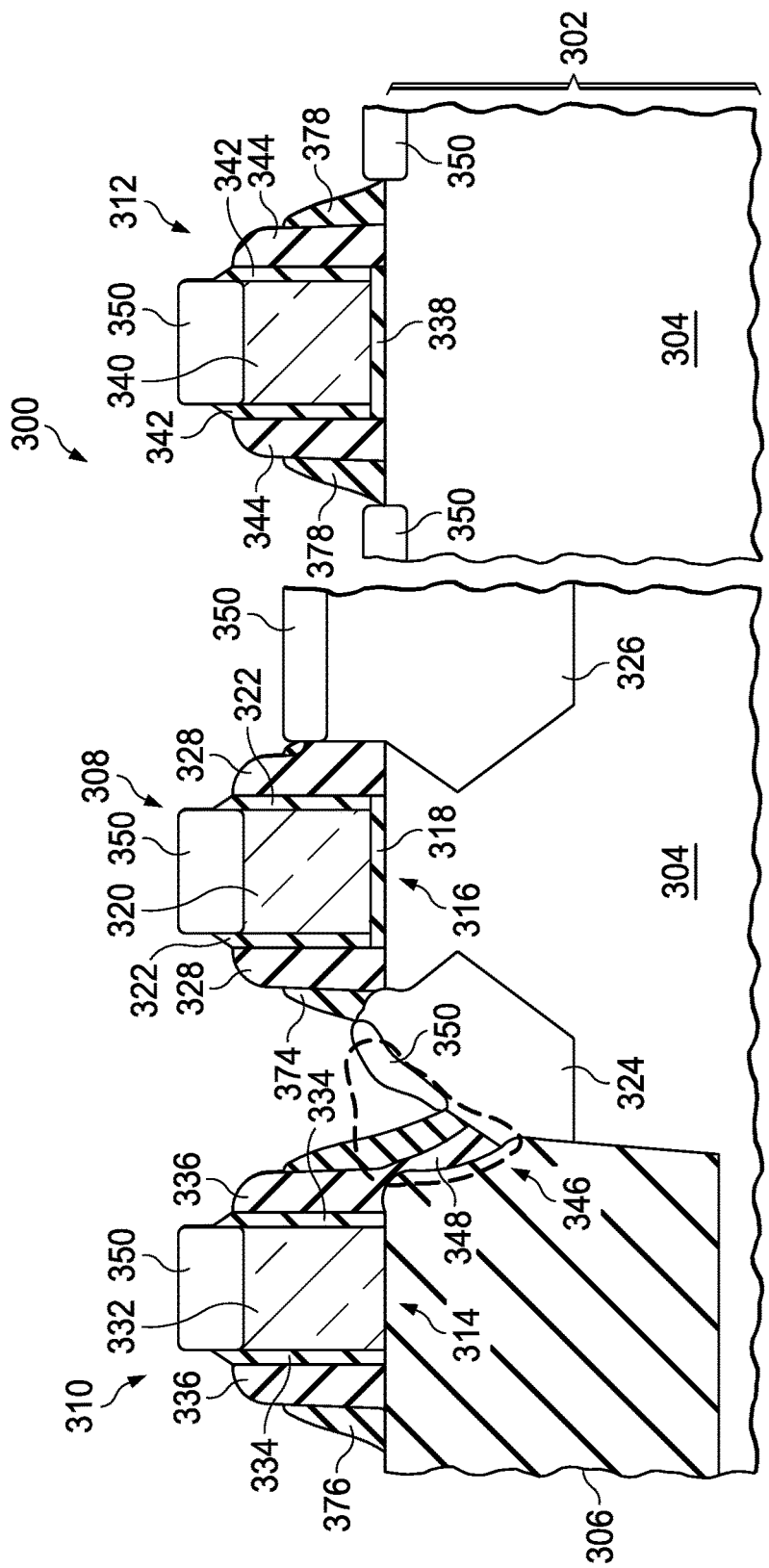

Referring to FIG. 3E, metal silicide 350 is formed on exposed semiconductor material, including the first epitaxial source/drain region 324 and the second epitaxial source/drain region 326, and possibly the source/drain regions of the second MOS transistor 312. The metal silicide 350 may also be formed over the gates 320, 332 and 340. The metal silicide 350 on the first epitaxial source/drain region 324 extends into the gap 346 on the angled facet and covers at least one third of the first epitaxial source/drain region 324. The metal silicide 350 may be formed, for example, as described in reference to FIG. 2H.

Figure 3F:
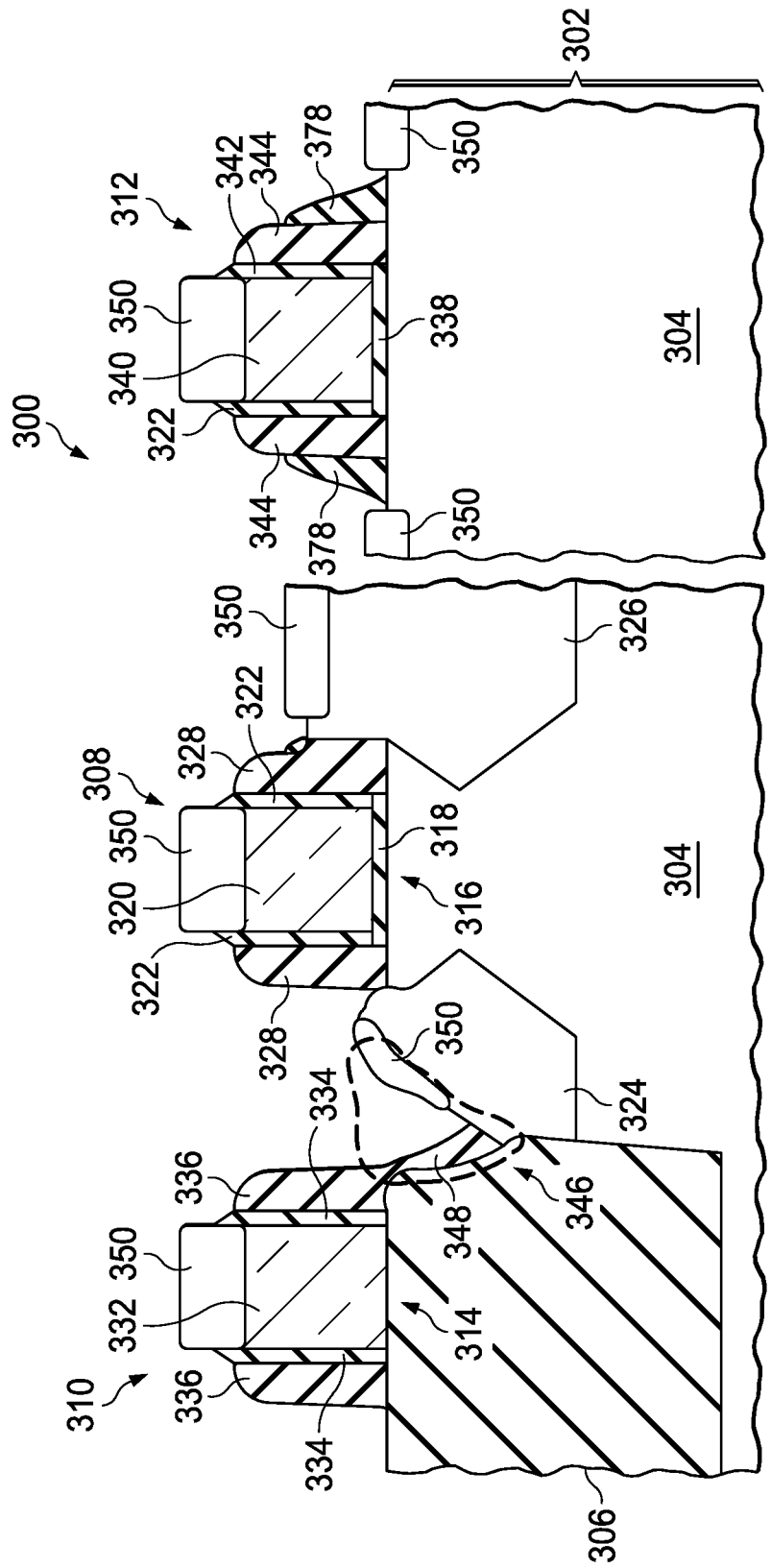

Referring to FIG. 3F, the sacrificial spacers 374, 376 and 378 of FIG. 3E are removed, for example using an isotropic plasma etch which is selective to the silicon-dioxide-based dielectric material of the source/drain spacers 328, 336 and 344. The gap filler 348 is substantially intact after the sacrificial spacers 374, 376 and 378 are removed.

Figure 3G:
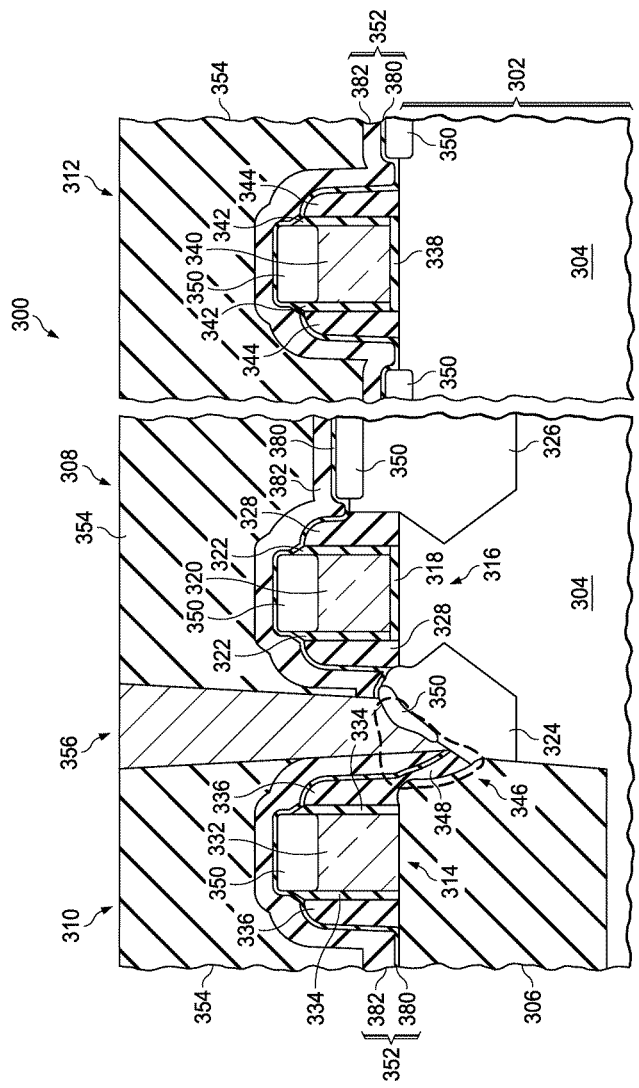

Referring to FIG. 3G, a first sublayer 380 of a CESL 352 is formed over an existing top surface of the integrated circuit 300. The first sublayer 380 includes 2 nanometers to 10 nanometers of silicon dioxide-based dielectric material, formed by a PECVD process. A second sublayer 382 of the CESL 352 is formed on the first sublayer 380. The second sublayer 382 is predominantly non-silicon dioxide-based dielectric material such as silicon nitride, 10 nanometers to 30 nanometers thick, formed by a PECVD process. A PMD layer 354 is formed over the CESL 352, for example as described in reference to FIG. 1 and FIG. 2H. A contact 356 is formed through the PMD layer 354 and CESL 352 to make direct connection with the metal silicide 350 on the first epitaxial source/drain region 324. The contact 356 may be formed as described in reference to FIG. 2H.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a substrate comprising semiconductor material;
field oxide disposed in the substrate;
a first metal oxide semiconductor (MOS) transistor of a first polarity, comprising:
  a gate dielectric layer;
  a gate over the gate dielectric layer of the first MOS transistor;
  a first source/drain region in the substrate between the gate of the first MOS transistor and the field oxide, abutting the field oxide, having an angled facet facing the field oxide such that the first source/drain region is laterally separated from the field oxide at a top surface of the field oxide by a gap which extends at least 20 nanometers down from the top surface of the field oxide;
  a second source/drain region in the substrate on an opposite side of the gate from the first source/drain region; and
  source/drain spacers laterally adjacent to the gate;
a gap filler of silicon dioxide-based dielectric material in the gap, abutting the field oxide and extending down to and contacting the first source/drain region at a bottom of the gap;
metal silicide on the angled facet of the first source/drain region, a portion of the metal silicide being in the gap; and
a contact on the metal silicide on the angled facet of the first source/drain region, a portion of the contact extending into the gap.

2. The integrated circuit of claim 1, wherein a top surface of the field oxide is coplanar within 20 nanometers of a top surface of the substrate under the gate dielectric layer.

3. The integrated circuit of claim 1, wherein the source/drain spacers of the gate structure are predominantly non-silicon dioxide dielectric material, and the metal silicide covers at least one half of the first source/drain region.

4. The integrated circuit of claim 3, further comprising a spacer liner of silicon dioxide-based dielectric material under the source/drain spacers of the first MOS transistor and the source/drain spacers of the gate structure.

5. The integrated circuit of claim 1, wherein the source/drain spacers of the gate structure are predominantly silicon dioxide-based dielectric material, the gap filler is a portion of the source/drain spacers of the gate structure, and the metal silicide covers at least one third of the first source/drain region.

6. The integrated circuit of claim 1, wherein the metal silicide is predominantly nickel silicide.

7. The integrated circuit of claim 1, further comprising a second MOS transistor of a second, opposite, polarity.

8. The integrated circuit of claim 1, wherein:
the first MOS transistor is a p-channel metal oxide semiconductor (PMOS) transistor; and
the first source/drain region and the second source/drain region comprise silicon-germanium.

9. The integrated circuit of claim 1, wherein:
the first MOS transistor is an n-channel metal oxide semiconductor (NMOS) transistor; and
the first source/drain region and the second source/drain region comprise phosphorus doped silicon.

10. An integrated circuit, comprising:
a substrate comprising semiconductor material;
field oxide disposed in the substrate;
a first metal oxide semiconductor (MOS) transistor of a first polarity, comprising:
  a gate dielectric layer;
  a gate over the gate dielectric layer of the first MOS transistor;
  a first source/drain region in the substrate between the gate of the first MOS transistor and the field oxide, abutting the field oxide, having an angled facet facing the field oxide such that the first source/drain region is laterally separated from the field oxide at a top surface of the field oxide by a gap which extends down from the top surface of the field oxide;
  a second source/drain region in the substrate on an opposite side of the gate of the first MOS transistor from the first source/drain region; and source/drain spacers laterally adjacent to the gate of the first MOS transistor;
a second MOS transistor of a second polarity;
a gate structure over the field oxide, comprising:
   a gate over the field oxide, such that the gate does not overlap an edge of the field oxide between the gate structure and the first MOS transistor; and
   source/drain spacers laterally adjacent to the gate of the gate structure;
a gap filler of silicon dioxide based dielectric material in the gap, abutting the field oxide and extending down to and contacting the first source/drain region at a bottom of the gap;
metal silicide on the angled facet of the first source/drain region, a portion of the metal silicide being in the gap; and
a contact on the metal silicide on the angled facet of the first source/drain region, a portion of the contact extending into the gap.

11. The integrated circuit of claim 10, wherein the metal silicide covers at least one half of the first source/drain region.

12. The integrated circuit of claim 10, further comprising a spacer liner of silicon dioxide-based dielectric material under the source/drain spacers of the first MOS transistor and the source/drain spacers of the gate structure.

13. The integrated circuit of claim 10, wherein the source/drain spacers of the gate structure are predominantly silicon dioxide-based dielectric material, the gap filler is a portion of the source/drain spacers of the gate structure, and the metal silicide covers at least one third of the first source/drain region.

14. The integrated circuit of claim 10, wherein the metal silicide is predominantly nickel silicide.

15. The integrated circuit of claim 10, wherein:
the first MOS transistor is a p-channel metal oxide semiconductor (PMOS) transistor; and
the first source/drain region and the second source/drain region comprise silicon-germanium.

16. The integrated circuit of claim 10, wherein:
the first MOS transistor is an n-channel metal oxide semiconductor (NMOS) transistor; and
the first source/drain region and the second source/drain region comprise phosphorus doped silicon.

17. An integrated circuit, comprising:
a substrate comprising semiconductor material;
field oxide disposed in the substrate;
a p-type metal oxide semiconductor (PMOS) transistor, comprising:
   a gate dielectric layer at a top surface of the semiconductor material;
   a gate over the gate dielectric layer of the PMOS transistor;
   a first silicon germanium (SiGe) source/drain region in the substrate between the gate of the PMOS transistor and the field oxide, abutting the field oxide, having an angled facet facing the field oxide such that the first SiGe source/drain region is laterally separated from the field oxide at a top surface of the field oxide by a gap which extends at least 20 nanometers down from the top surface of the field oxide;
   a second SiGe source/drain region in the substrate adjacent to the gate of the PMOS transistor, opposite from the first SiGe source/drain region, the second SiGe source/drain region not having an angled facet; and
   source/drain spacers laterally adjacent to the gate of the PMOS transistor;
a gap filler of silicon dioxide-based dielectric material in the gap, abutting the field oxide and extending down to and contacting the first SiGe source/drain region at a bottom of the gap;
metal silicide on a portion of the angled facet of the first SiGe source/drain region, a portion of the metal silicide being in the gap; and
a contact on the metal silicide on the angled facet of the first SiGe source/drain region, a portion of the contact extending into the gap.

* * * * *